(12) United States Patent
Song et al.

(10) Patent No.: US 8,227,925 B2
(45) Date of Patent: Jul. 24, 2012

(54) INTEGRATED CIRCUIT PACKAGING SYSTEM WITH INTERPOSER

(75) Inventors: Sungmin Song, Inchon (KR); SeongMin Lee, Seoul (KR); WonJun Ko, Sungnam-Si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/397,562

(22) Filed: Feb. 15, 2012

(65) Prior Publication Data

US 2012/0146243 A1    Jun. 14, 2012

Related U.S. Application Data

(62) Division of application No. 11/859,359, filed on Sep. 21, 2007, now Pat. No. 8,124,451.

(51) Int. Cl.
*H01L 23/48* (2006.01)
*H01L 23/52* (2006.01)
*H01L 29/40* (2006.01)

(52) U.S. Cl. ................... 257/777; 257/E23.062
(58) Field of Classification Search ............ 257/777, 257/781, E23.062
See application file for complete search history.

(56) References Cited

U.S. PATENT DOCUMENTS

| | | |
|---|---|---|
| 5,579,207 A | 11/1996 | Hayden et al. |
| 5,748,452 A | 5/1998 | Londa |
| 5,854,507 A | 12/1998 | Miremadi et al. |
| 5,963,430 A | 10/1999 | Londa |
| 6,083,775 A | 7/2000 | Huang et al. |
| 6,101,100 A | 8/2000 | Londa |
| 6,165,815 A | 12/2000 | Ball |
| 6,242,932 B1 | 6/2001 | Hembree |
| 6,441,481 B1 | 8/2002 | Karpman |
| 6,529,027 B1 | 3/2003 | Akram et al. |
| 6,544,816 B1 | 4/2003 | Lim et al. |
| 6,555,917 B1 | 4/2003 | Heo |
| 6,618,267 B1 | 9/2003 | Dalal et al. |
| 6,737,750 B1 * | 5/2004 | Hoffman et al. ............ 257/777 |
| 6,838,761 B2 | 1/2005 | Karnezos |
| 6,861,288 B2 | 3/2005 | Shim et al. |
| 7,093,358 B2 | 8/2006 | Akram et al. |
| 7,109,574 B2 | 9/2006 | Chiu et al. |
| 7,119,427 B2 | 10/2006 | Kim |
| 7,259,455 B2 | 8/2007 | Seto |
| 2003/0197260 A1 | 10/2003 | Nishimura et al. |
| 2004/0119153 A1 | 6/2004 | Karnezos |
| 2004/0126910 A1 | 7/2004 | Thomas et al. |
| 2004/0163240 A1 | 8/2004 | Frezza |
| 2004/0201087 A1 | 10/2004 | Lee |
| 2005/0118791 A1 | 6/2005 | Sato et al. |
| 2006/0220256 A1 | 10/2006 | Shim et al. |

FOREIGN PATENT DOCUMENTS

| | | |
|---|---|---|
| JP | 2002261232 A | 9/2002 |
| JP | 2003086733 A | 3/2003 |
| JP | 2004297071 A | 10/2004 |
| JP | 2005539403 A | 12/2005 |
| WO | 2004027823 A | 4/2004 |
| WO | 2004034433 A2 | 4/2004 |

* cited by examiner

*Primary Examiner* — Jenny L Wagner
(74) *Attorney, Agent, or Firm* — Ishimaru & Associates LLP; Mikio Ishimaru; Stanley Chang

(57) ABSTRACT

An integrated circuit packaging system comprising: a base package substrate; a first integrated circuit die attached over the base package substrate; and an interposer having a recessed edge and a corner that extends to a singulation edge, the interposer mounted over the first integrated circuit die, the interposer having a recess gap between the recessed edge and the singulation edge.

10 Claims, 6 Drawing Sheets

INTEGRATED CIRCUIT PACKAGING SYSTEM WITH INTERPOSER

CROSS-REFERENCE TO RELATED APPLICATION(S)

The present application is a divisional of U.S. patent application Ser. No. 11/859,359, filed Sep. 21, 2007 which contains subject matter related to U.S. patent application Ser. No. 11/306,628, now U.S. Pat. No. 7,364,945. The related application is assigned to STATS ChipPAC Ltd.

TECHNICAL FIELD

The present invention relates generally to integrated circuit packaging, and more particularly to a system for forming three dimensional stacked packages with an interposer.

BACKGROUND ART

Integrated circuits are used in many portable electronic products, such as cell phones, portable computers, voice recorders, etc. They are also used in many larger electronic systems, such as cars, planes, industrial control systems, and the like. Across virtually all applications, there continues to be demand for reducing the size and increasing performance of the devices. The intense demand is now at a peak in portable electronics that have become so ubiquitous and are frequently shrinking in size.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance and smaller component size.

Some of the functions that are required to support the new applications are based on different technologies. As an example, high capacity memory may be built in a different technology than a high speed processor. This situation prevents them from being fabricated on the same silicon wafer, but the different technologies can be packaged together to deliver highly space efficient components.

Drawbacks of conventional designs include a relatively large footprint of the package on the mounting surface of motherboard. The footprint reflects what is typically measured as the maximum dimension of the package, namely, the x-y dimension. In applications where mounting space is at a premium, such as pagers, portable telephones, and personal computers, among others, a large footprint is undesirable. With the goal of increasing the amount of circuitry in a package, but without increasing the area of the package so that the package does not take up any more space on the circuit board, manufacturers have been stacking two or more die within a single package. Unfortunately, sufficient overlap for electrical interconnect and large footprint top packages have plagued previous stacked package or package on package designs.

Thus, a need still remains for an integrated circuit packaging system with interposer, that can support high volume and high quality stacked package designs. In view of the ever-increasing demand for more functions in a smaller space, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit packaging system comprising: a base package substrate; a first integrated circuit die attached over the base package substrate; and an interposer having a recessed edge and a corner that extends to a singulation edge, the interposer mounted over the first integrated circuit die, the interposer having a recess gap between the recessed edge and the singulation edge.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
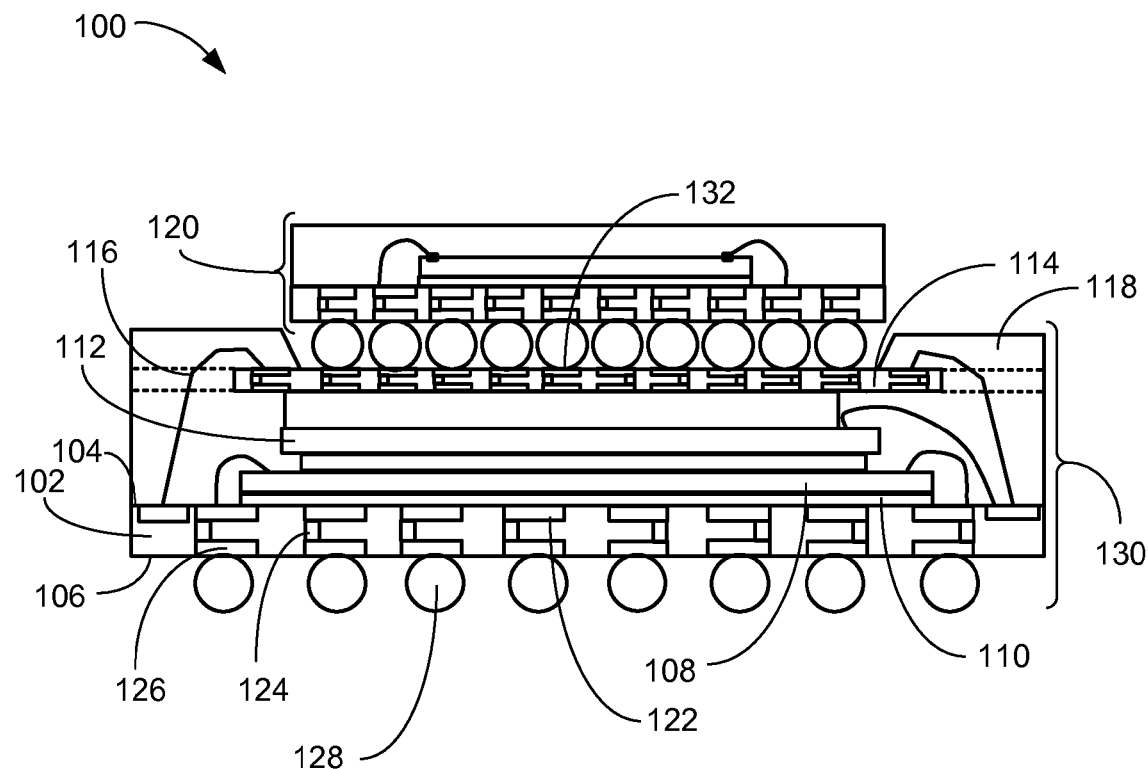
FIG. 1 is a cross-sectional view of an integrated circuit packaging system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an integrated circuit packaging system 100, in an embodiment of the present invention. The cross-sectional view of the integrated circuit packaging system depicts a base package substrate 102 having an upper surface 104 and a lower surface 106. A first integrated circuit die 108 is attached to the upper surface 104 by an adhesive 110, such as a die attach material. A second integrated circuit die 112 is attached over the first integrated circuit die 108 by the adhesive 110. An interposer 114 is attached over the second integrated circuit die 112 by the adhesive 110. Electrical interconnects 116, such as bonding wires, couple the upper surface 104 of the base package substrate 102, the first integrated circuit die 108, the second integrated circuit die 112, the interposer 114, or a combination thereof.

An encapsulant 118, such as an epoxy molding compound, may be formed over the electrical interconnects 116, the upper surface 104 of the base package substrate 102, the first integrated circuit die 108, the second integrated circuit die 112, the adhesive 110, and a portion of the interposer 114. Only the edges of the interposer 114 have the encapsulant 118 on it. The center area of the interposer 114 remains clear for mounting an additional integrated circuit package 120 thereon.

The base package substrate 102 may have an upper surface contact 122. The upper surface contact 122 may provide a conductive path for the electrical interconnects 116 by contacting base package vias 124, lower surface contacts 126, and system interconnects 128, such as a solder ball, solder column, solder bump, or stud bump. The structure of a base package 130 includes the base package substrate 102, the adhesive 110, the first integrated circuit die 108, the second integrated circuit die 112, the interposer 114, the electrical interconnects 116, the encapsulant 118 and the system interconnects 128.

The embodiment shown in FIG. 1 is an example only. The base package 130 is shown having the first integrated circuit die 108 and the second integrated circuit die 112 under the interposer 114. An embodiment of the present invention may have more than two of the first integrated circuit die 108 mounted over the base package substrate 102. While the integrated circuit dice 108 are shown as wire bond type, it is understood that flip chip type of the second integrated circuit die 112 may also be used. Interposer contacts 132 are distributed on the top surface of the interposer 114 for attaching the additional integrated circuit package 120.

Figure 2:
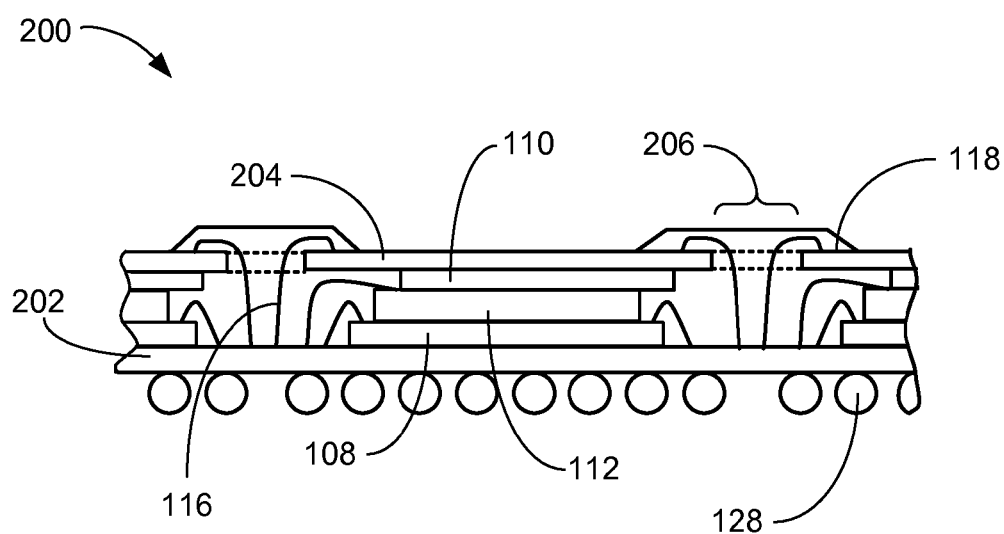
FIG. 2 is a cross-sectional view of a base package array in a pre-singulation phase of manufacturing.

Referring now to FIG. 2, therein is shown a cross-sectional view of a base package array 200 in a pre-singulation phase of manufacturing. The cross-sectional view of the base package array 200 depicts a base package substrate sheet 202 having several of the first integrated circuit die 108 mounted thereon. The second integrated circuit die 112 is mounted over each the first integrated circuit die 108. The adhesive 110 adheres an interposer array 204, having access openings 206, over the second integrated circuit die 112. The electrical interconnects 116 may be coupled between the base package substrate sheet 202 and the interposer array 204 through the access openings 206.

During the molding process, the encapsulant 118 flows through the access openings 206 in the interposer array 204 to surround the electrical interconnects 116, the first integrated circuit die 108, the second integrated circuit die 112, the adhesive 110, and a top surface of the base package substrate sheet 202. The system interconnects 128 may be adhered to the bottom surface of the base package substrate sheet 202 for electrical connection to the next level system (not shown).

Attaching the interposer array 204 provides a stable surface that resists warping. This is significant to the manufacturing process as it reduces the amount of excess of the encapsulant 118, known as flash, that may be extruded onto the contact surface of the interposer array 204.

Figure 3:
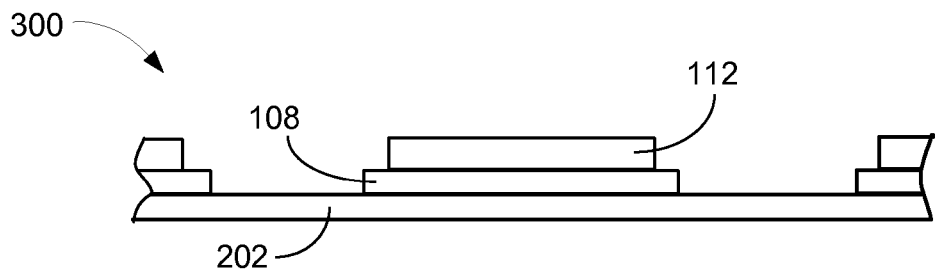
FIG. 3 is a cross-sectional view of a stacked die assembly of the base package in a die attach phase of manufacturing.

Referring now to FIG. 3, therein is shown a cross-sectional view of a stacked die assembly 300 of the base package 130, of FIG. 1, in a die attach phase of manufacturing. The cross-sectional view of the stacked die assembly depicts the base package substrate sheet 202 having a number of the first integrated circuit die 108 mounted thereon. The second integrated circuit die 112 is mounted over each of the first integrated circuit die 108. The first integrated circuit die 108 and the second integrated circuit die 112 may be attached by the adhesive 110, of FIG. 1.

Figure 4:
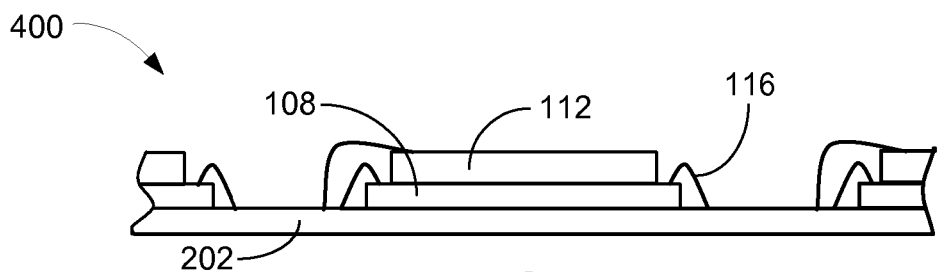
FIG. 4 is a cross-sectional view of a stacked die assembly in an electrical interconnect phase of manufacturing.

Referring now to FIG. 4, therein is shown a cross-sectional view of a stacked die assembly 400 in an electrical interconnect phase of manufacturing. The cross-sectional view of the stacked die assembly 400 depicts the base package substrate sheet 202 having a number of the first integrated circuit die 108 mounted thereon. The second integrated circuit die 112 is mounted over each of the first integrated circuit die 108. The electrical interconnects 116 may be coupled between the first integrated circuit die 108, the second integrated circuit die 112, the base package substrate sheet 202, or a combination thereof.

Figure 5:
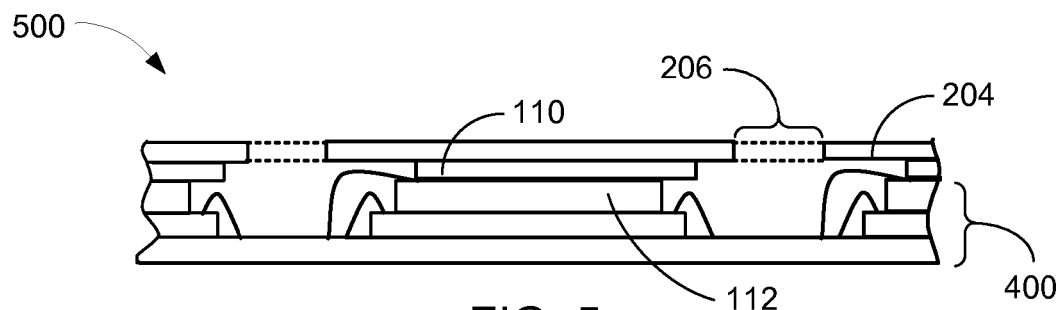
FIG. 5 is a cross-sectional view of a stacked die assembly in an interposer attach phase of manufacturing.

Referring now to FIG. 5, therein is shown a cross-sectional view of a stacked die assembly 500 in an interposer attach phase of manufacturing. The cross-sectional view of the stacked die assembly 500 depicts the stacked die assembly 400 with the interposer array 204 mounted over the second integrated circuit die 112 by the adhesive 110. The application of the interposer array 204 provides a flat uniform surface for further manufacturing processes.

Figure 6:
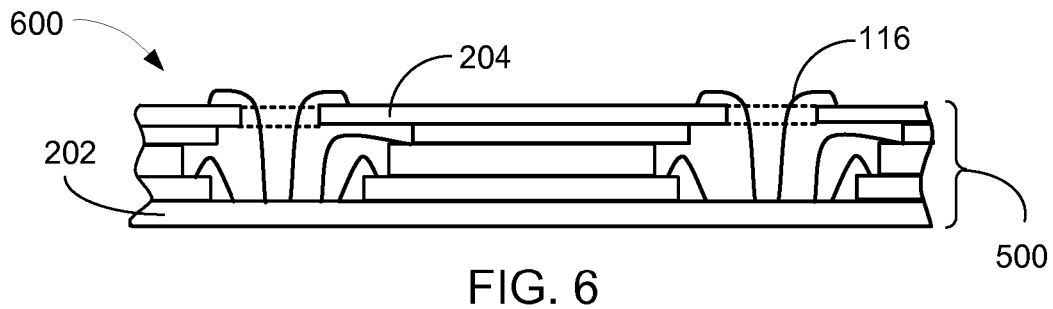
FIG. 6 is a cross-sectional view of a stacked die assembly in an interposer interconnect phase of manufacturing.

Referring now to FIG. 6, therein is shown a cross-sectional view of a stacked die assembly 600 in an interposer interconnect phase of manufacturing. The cross-sectional view of the stacked die assembly 600 depicts the stacked die assembly 500 having the electrical interconnects 116 for coupling the interposer array 204 to the base package substrate sheet 202.

Figure 7:
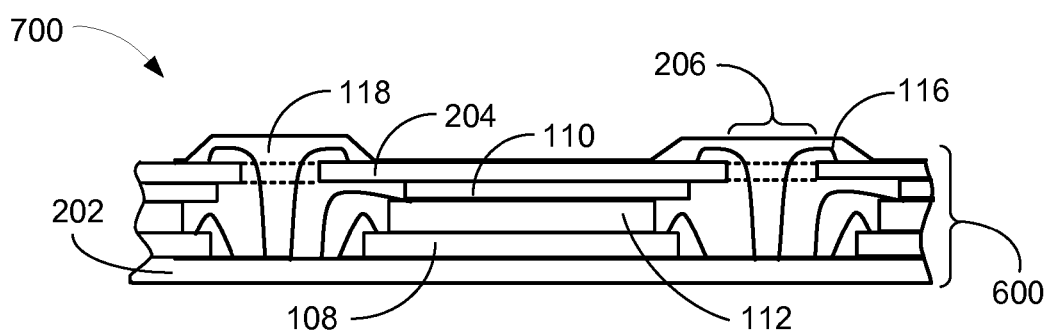
FIG. 7 is a cross-sectional view of a stacked die assembly in an encapsulation phase of manufacturing.

Referring now to FIG. 7, therein is shown a cross-sectional view of a stacked die assembly 700 in an encapsulation phase of manufacturing. The cross-sectional view of the stacked die assembly 700 depicts the stacked die assembly 600 having the encapsulant 118 molded over the electrical interconnects 116, the first integrated circuit die 108, the second integrated circuit die 112, the adhesive 110, the top surface of the base package substrate sheet 202, and a portion of the interposer array 204. The encapsulant 118 passes through the access opening 206 to flow around the electrical interconnects 116, the first integrated circuit die 108, the second integrated circuit die 112, the adhesive 110, and the top surface of the base package substrate sheet 202.

Figure 8:
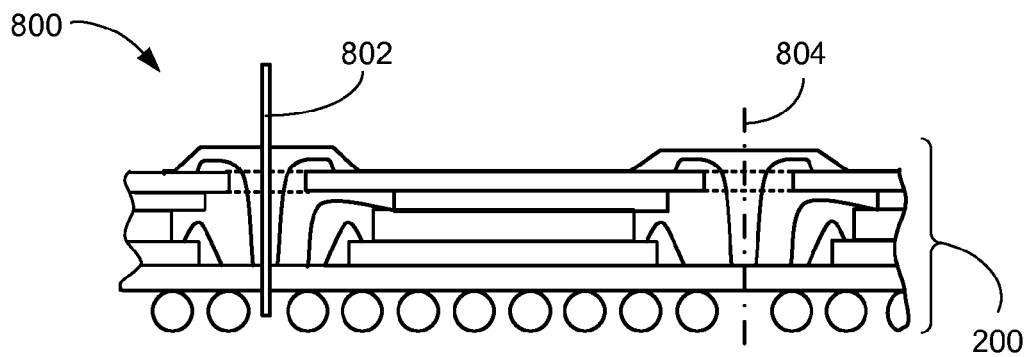
FIG. 8 is a cross-sectional view of a base package array in a singulation phase of manufacturing.

Referring now to FIG. 8, therein is shown a cross-sectional view of a base package array 800 in a singulation phase of manufacturing. The cross-sectional view of the base package array 800 depicts the base package array 200 with a singulation device 802, such as a singulation saw or a singulation shear, cutting the base package array 200 into single units. A singulation line 804 indicates the location of the next boundary of the single unit. The singulation device 802 passes through the center of the access opening 206, of FIG. 1, and through the base package substrate sheet 202, of FIG. 2, between the system interconnects 128, of FIG. 1. The resulting packaged device may be characterized as having been singulated by breaking, sawing, or cutting the package edges.

Figure 9:
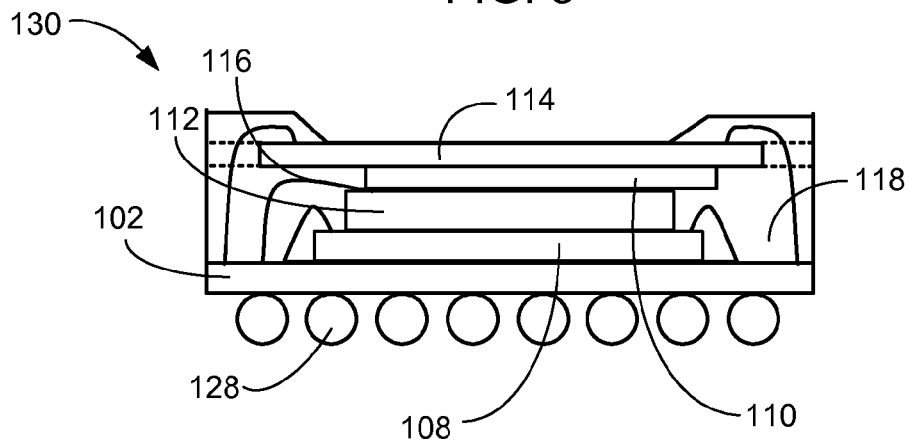
FIG. 9 is a cross-sectional view of a base package in a singulated state.

Referring now to FIG. 9, therein is shown a cross-sectional view of the base package 130 in a singulated state. The cross-sectional view of the base package 130 depicts the base package substrate 102, the first integrated circuit die 108 is mounted over the base package substrate 102. The electrical interconnects 116 couple the first integrated circuit die 108 to the base package substrate 102. The second integrated circuit die 112 is mounted over the first integrated circuit die 108 and coupled to the base package substrate 102 by the electrical interconnects 116.

The adhesive 110 is on the second integrated circuit die 112 for mounting the interposer 114. The electrical interconnects 116 couple the base package substrate 102, the first integrated circuit die 108, the second integrated circuit die 112, the interposer 114, or a combination thereof.

Figure 10:
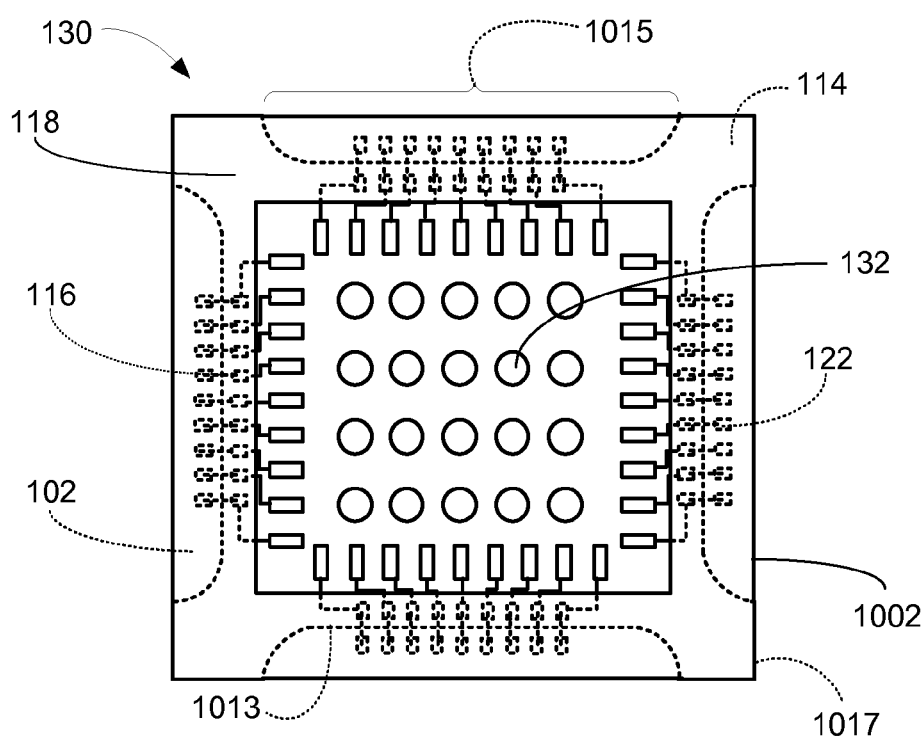
FIG. 10 is a top plan view of the base package of FIG. 9.

Referring now to FIG. 10, therein is shown a top plan view of the base package 130 of FIG. 1. The top plan view of the base package 130 depicts the interposer 114 partially enclosed by the encapsulant 118. The exposed area of the interposer 114 may have the interposer contacts 132 distributed thereon. The base package substrate 102 may have the upper surface contacts 122 for coupling the interposer 114 by the electrical interconnects 116, and the lower surface contacts 126, of FIG. 1, with system interconnects 128, of FIG. 1 mounted thereon. The shape of the interposer 114 reflects that it was part of the interposer array 204 of FIG. 2. The stability provided by this invention reduces the likelihood of the interposer 114 becoming warped during the manufacturing process. The base package 130 may include the interposer 114 having recessed edges 1013 and corners 1017 that extend to a singulation edge 1002 and the space between the base package substrate 102 and the interposer 114 filled by the encapsulant 118 to embed the first integrated circuit die 108, of FIG. 1, and the second integrated circuit die 112, of FIG. 1, therebetween. A recess gap 1015 can be characterized as the space between the recessed edge 1013 of the interposer 114 and the singulation edge 1002. The electrical interconnects 116 can pass through the recess gap 1015 to couple the interposer 114 and the base package substrate 102.

Figure 11:
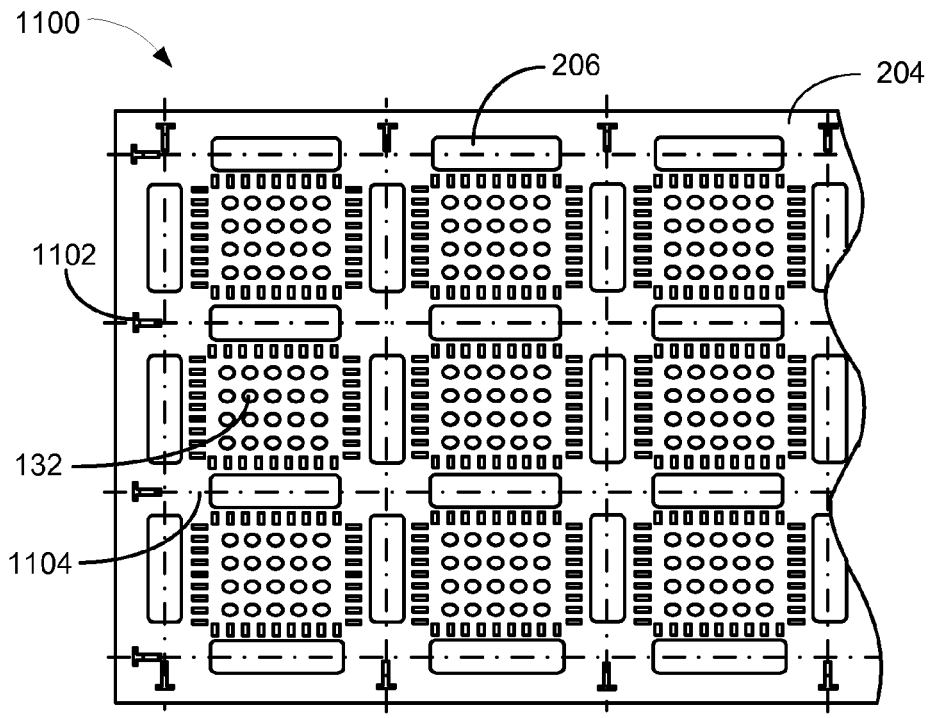
FIG. 11 is a top view of an interposer array, in an embodiment of the integrated circuit packaging system, of the present invention.

Referring now to FIG. 11, therein is shown a top view of an interposer array segment 1100, in an embodiment of the integrated circuit packaging system 100, of the present invention. The top view of the interposer array segment 1100 depicts the interposer array 204 having the access openings 206, the interposer contacts 132, singulation markers 1102 and singulation lines 1104. The singulation lines 1104 are added for clarity and may not be implemented in the actual embodiment of the invention.

When the interposer array 204 is implemented for a particular design the position and number of the interposer contacts 132 may be different. The current figure is for example only and does not limit the number, type, or position of the interposer contacts 132.

Figure 12:
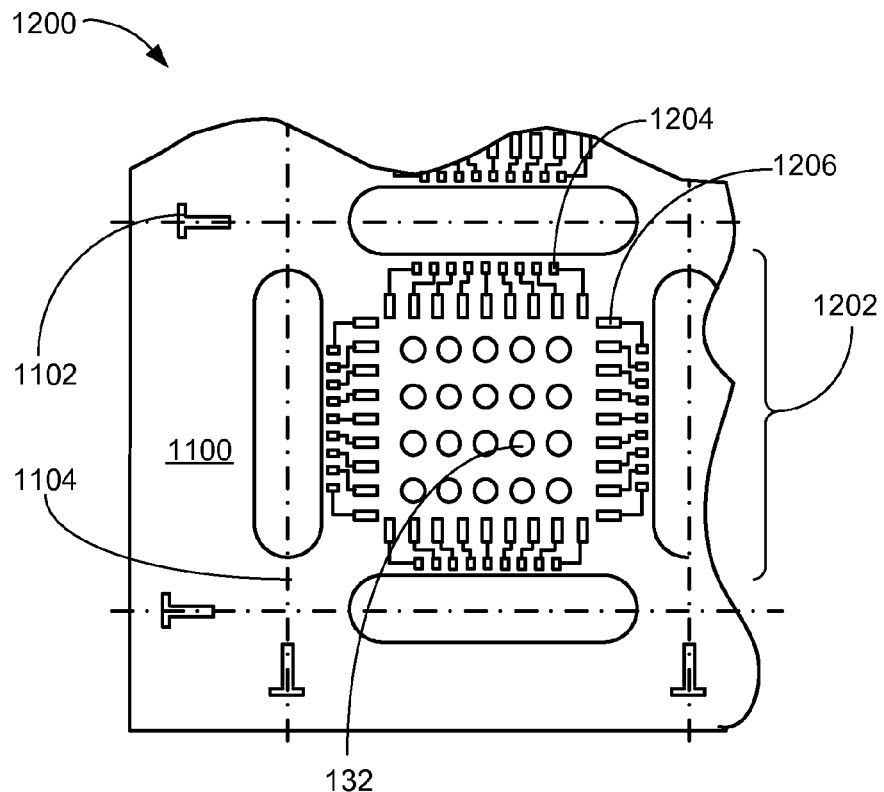
FIG. 12 is a magnified top view of an interposer from the interposer array of FIG. 11.

Referring now to FIG. 12, therein is shown a magnified top view of a single interposer 1200 from the interposer array 1100 of FIG. 11. The magnified top view of the single interposer 1200 depicts the interposer array 1100 having the singulation markers 1102 and the singulation lines 1104. The interposer contacts 132 are disposed across the surface of the single interposer 1200 in a contact array 1202. The contact array 1202 may contain interposer bonding contacts 1204, interposer pin pads 1206, the interposer contacts 132, or a combination thereof.

Figure 13:
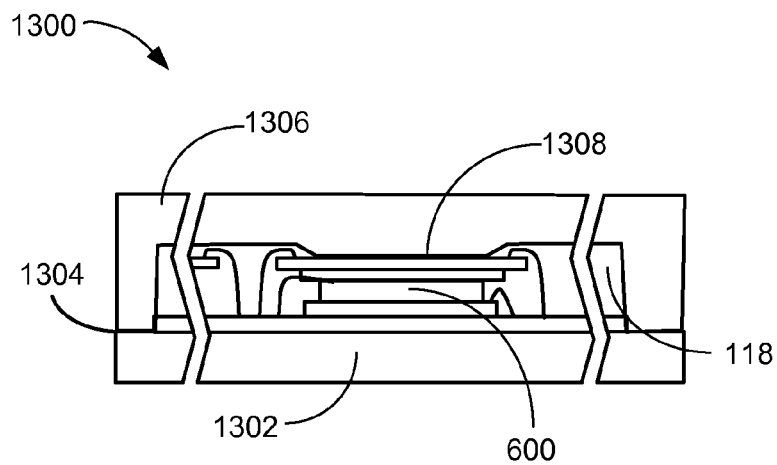
FIG. 13 is a cross-sectional view of a casting mold used for the encapsulation phase of manufacturing.

Referring now to FIG. 13, therein is shown a cross-sectional view of a casting mold 1300 used for the encapsulation phase of manufacturing. The cross-sectional view of the casting mold 1300 depicts a bottom mold chase 1302 having a mating section 1304 for attaching an upper mold chase 1306. The stacked die assembly 600 may be loaded in the upper mold chase 1306 in preparation for molding the encapsulant 118. A protrusion 1308 in the upper mold chase 1306 rests on the interposer array 204 of FIG. 2. The protrusion 1308 prevents the encapsulant 118 from flowing onto the interposer contacts 132 of FIG. 1 and the interposer pin pads 1206, of FIG. 12, of the contact array 1202, of FIG. 12, during the injection molding process.

Figure 14:
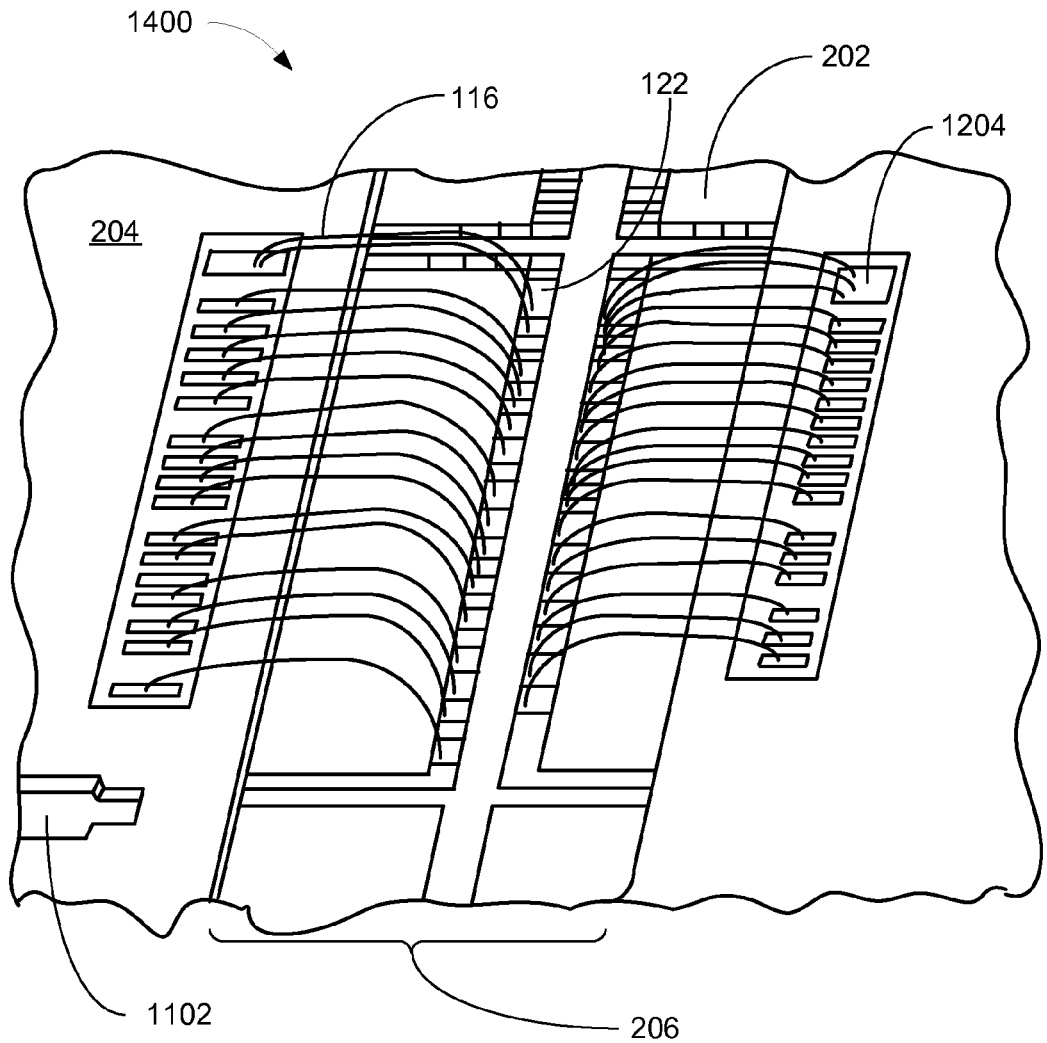
FIG. 14 is a magnified perspective view of the interposer interconnect phase of manufacturing of FIG. 6.

Referring now to FIG. 14, therein is shown a magnified perspective view of an electrical interconnect array 1400 during the interposer interconnect phase of manufacturing of FIG. 6. The magnified perspective view of the electrical interconnect array 1400 depicts the interposer array 204, having the interposer bonding contacts 1204. Is coupled by the electrical interconnects 116 to the upper surface contacts 122 of the base package substrate sheet 202.

The electrical interconnects 116 pass through the access opening 206 of the interposer array 204. The access opening 206 also allows the encapsulant 118 to easily flow through the package forming a reliable stacked die package.

Figure 15:
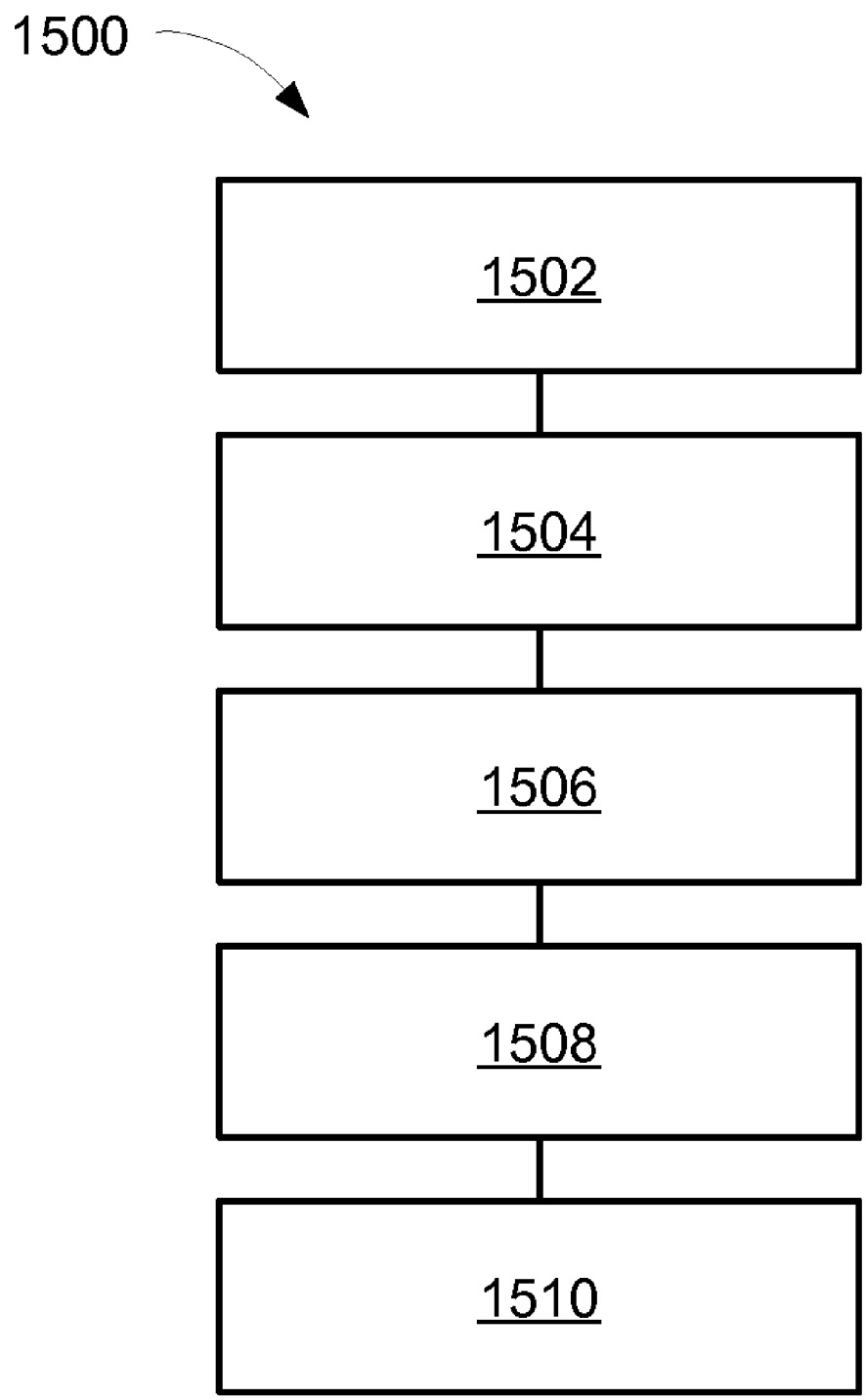
FIG. 15 is a flow chart of an integrated circuit packaging system for manufacturing the integrated circuit packaging system with interposer, in an embodiment of the present invention.

Referring now to FIG. 15, therein is shown a flow chart of an integrated circuit packaging system 1500 for manufacturing the integrated circuit packaging system in an embodiment of the present invention. The system 1500 includes fabricating an interposer array having an access opening in a block 1502; fabricating a base package substrate sheet in a block 1504; attaching a first integrated circuit die over the base package substrate sheet in a block 1506; mounting the interposer array over the first integrated circuit die in a block 1508;

and singulating a base package from the base package substrate sheet and the interposer array by cutting the access opening generally through the center in a block 1510.

It has been discovered that the present invention thus has numerous aspects.

A principle aspect of the present invention is that the interposer array of the integrated circuit packaging system prevents the interposer from becoming warped during the manufacturing process. This prevents the encapsulant from flowing onto the interposer contacts and the interposer pin pads.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit packaging system of the present invention furnishes important and heretofore unknown and unavailable solutions, capabilities, and functional aspects for high density integrated circuit packaging. The resulting processes and configurations are straightforward, cost-effective, uncomplicated, highly versatile and effective, can be surprisingly and unobviously implemented by adapting known technologies, and are thus readily suited for efficiently and economically manufacturing stacked die integrated circuit devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
a base package substrate;
a first integrated circuit die attached over the base package substrate; and
an interposer having a recessed edge and a corner that extends to a singulation edge, the interposer mounted over the first integrated circuit die, the interposer having a recess gap between the recessed edge and the singulation edge.

2. The system as claimed in claim 1 further comprising an electrical interconnect coupled between the interposer and the base package substrate through the recess gap in the interposer.

3. The system as claimed in claim 1 further comprising an encapsulant molded through the recess gap in the interposer.

4. The system as claimed in claim 1 further comprising a second integrated circuit die mounted over the first integrated circuit die.

5. The system as claimed in claim 1 further comprising a contact array on the interposer, the contact array including interposer bonding contacts, interposer pin pads, interposer contacts, or a combination thereof.

6. The system as claimed in claim 1 further comprising:
an interposer bonding contact adjacent to the recess gap in the interposer;
an upper surface contact on the base package substrate; and
an adhesive between the base package substrate and the first integrated circuit die includes the adhesive between the interposer and the first integrated circuit die.

7. The system as claimed in claim 6 further comprising:
an electrical interconnect through the recess gap coupled between the interposer and the base package substrate; and
a second integrated circuit die coupled to the first integrated circuit die, the base package substrate, the interposer, or a combination thereof.

8. The system as claimed in claim 6 further comprising:
an encapsulant molded through the recess gap; and
an electrical interconnect and a portion of the interposer encased in the encapsulant.

9. The system as claimed in claim 6 further comprising a second integrated circuit die mounted over the first integrated circuit die;
wherein:
the adhesive is between the first integrated circuit die and the second integrated circuit die.

10. The system as claimed in claim 6 further comprising:
a contact array on the interposer, the contact array including interposer bonding contacts, interposer pin pads, interposer contacts, or a combination thereof; and
an encapsulant molded over the interposer bonding contacts and not on the interposer pin pads or the interposer contacts.

* * * * *